(12) United States Patent
Anderson et al.

(10) Patent No.: US 7,795,098 B1
(45) Date of Patent: Sep. 14, 2010

(54) ROTATED FIELD EFFECT TRANSISTORS AND METHOD OF MANUFACTURE

(75) Inventors: Brent A. Anderson, Jericho, VT (US); Andres Bryant, Burlington, VT (US); Myung-hee Na, Lagrangeville, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 11/873,886

(22) Filed: Oct. 17, 2007

Related U.S. Application Data

(63) Continuation of application No. 11/164,070, filed on Nov. 9, 2005, now Pat. No. 7,335,563.

(51) Int. Cl.
*H01L 21/336* (2006.01)

(52) U.S. Cl. .................. 438/289; 438/301; 438/302; 438/305; 438/306; 257/204; 257/206; 257/401; 257/E27.014; 257/E21.415; 257/E21.633; 257/E21.634; 257/E21.703

(58) Field of Classification Search ......... 438/275–276, 438/289, 301, 302, 305, 306; 257/204, 206, 257/401, E27.014, E21.415, E21.633, E21.634, 257/E21.703
See application file for complete search history.

(56) References Cited

U.S. PATENT DOCUMENTS

| | | | |
|---|---|---|---|
| 5,270,226 A * | 12/1993 | Hori et al. ............... 438/302 |
| 5,405,795 A | 4/1995 | Beyer | |
| 5,543,337 A | 8/1996 | Yeh et al. | |
| 5,573,961 A | 11/1996 | Hsu et al. | |
| 5,652,454 A | 7/1997 | Iwamatsu et al. | |
| 5,818,085 A | 10/1998 | Hsu et al. | |
| 5,962,895 A | 10/1999 | Beyer et al. | |
| 5,965,917 A | 10/1999 | Maszara et al. | |
| 5,976,937 A * | 11/1999 | Rodder et al. ............... 438/275 |
| 6,156,589 A | 12/2000 | Noble | |
| 6,177,708 B1 | 1/2001 | Kuang et al. | |
| 6,387,739 B1 | 5/2002 | Smith, III | |
| 6,458,665 B1 * | 10/2002 | Kim ......................... 438/302 |
| 6,509,241 B2 | 1/2003 | Park et al. | |
| 6,580,137 B2 | 6/2003 | Parke | |
| 6,596,554 B2 | 7/2003 | Unnikrishnan | |
| 6,617,214 B2 | 9/2003 | Yeap et al. | |
| 6,642,579 B2 | 11/2003 | Fung | |
| 6,750,109 B2 | 6/2004 | Culp et al. | |
| 6,943,407 B2 * | 9/2005 | Ouyang et al. ............... 257/329 |
| 2001/0042889 A1 * | 11/2001 | Kang ......................... 257/371 |
| 2001/0046740 A1 * | 11/2001 | Kim et al. .................. 438/275 |
| 2002/0197839 A1 | 12/2002 | Dokumaci et al. | |
| 2004/0241969 A1 | 12/2004 | Wu et al. | |
| 2005/0056884 A1 | 3/2005 | Osabe et al. | |

* cited by examiner

*Primary Examiner*—Tu-Tu V Ho
(74) *Attorney, Agent, or Firm*—Anthony Canale; Roberts Mlotkowski Safran & Cole, P.C.

(57) ABSTRACT

An apparatus and method for manufacturing rotated field effect transistors. The method comprises providing a substrate including a first gate structure and a second gate structure, which are not parallel to each other. The method further includes performing a first ion implant substantially orthogonal to an edge of the first gate structure to form a first impurity region and performing a second ion implant at a direction different than that of the first ion implant and substantially orthogonal to an edge of the second gate structure to form a second impurity region under the edge of the second gate structure.

20 Claims, 8 Drawing Sheets

ROTATED FIELD EFFECT TRANSISTORS AND METHOD OF MANUFACTURE

CROSS REFERENCE TO RELATED APPLICATIONS

This application is a continuation application of U.S. patent application Ser. No. 11/164,070 filed on Nov. 9, 2005 now U.S. Pat. No. 7,335,563, the contents of which are incorporated herein by reference in their entirety.

FIELD OF THE INVENTION

The invention relates to a semiconductor device, and more particularly to a device having integrated rotated field effect transistors (FETs) and a method of manufacturing.

BACKGROUND DESCRIPTION

A field-effect transistor (FET, also referred to as a MOSFET) relies on an electric field to control the potential of the free-carrier concentration in, and hence the conductivity of a "channel" in a semiconductor material. The voltage applied between the gate and source terminals modulates the current between the source and drain of the FET.

MOSFETs are made with semiconductor processing techniques, common in the field of semiconductor manufacturing. The most common use of MOSFETs is the CMOS (complementary metal oxide semiconductor) integrated circuit which is the basis for most digital electronic devices. FETs are also used in analog devices. In digital integrated circuit technology, an output signal in response to the input signal is either "on" or "off", which is designed to assure as rapid as possible a switch of an output signal from the "on" to "off" state (and vice versa) with as little energy as possible and with maximum noise rejection. In analog integrated circuit technology an output signal follows continuously an input signal.

FETs for digital applications have requirements which differ from those for analog applications. For example, it is very important to maintain minimum dimensions of the channel, and hence gate-length, of a digital application FET; this results in high drain current and in low gate capacitance, both of which contribute to fast switching speed. Furthermore, high halo concentrations are required in such short-channel FETs to maintain effective control of the channel by the gate. Thus it is important to maintain good linewidth control of FET gates in digital applications. By contrast, analog applications typically demand more-ideal output characteristics such as low drain conductance (Gds) and good threshold voltage tolerance and matching. These characteristics are attained with longer channels and thus longer gate length FETs, and typically with weaker halo doses. Thus the structural and electrical demands differ between the two applications, digital and analog.

In order to fabricate an integrated circuit with FETs for both analog and digital applications, it is important to thus maintain different doping and electrical characteristics of these devices. In doing so, during the extension and halo implant of the FETs for the digital application, it is important to protect the FETs for the analog devices, and vice versa. This will ensure that the dopants intended for the digital FETs will not reach under underneath the channel region of the analog FET gates, which are not being doped in these steps. In order to provide analog FET and digital FET doping profiles that are independent of one another, one must selectively cover (typically with photo-resist) one set of devices, e.g. the analog FETs, while performing extension and halo ion implantations for the second set, e.g. the digital FETs, and then, remove the covering resist, cover the second set of devices, e.g. the digital FETs, selectively, and perform the extension and halo ion implantations for the second set of devices. This is an expensive and time-consuming process.

SUMMARY OF THE INVENTION

In a first aspect of the invention, a method includes providing a substrate including a first gate structure and a second gate structure, which are not parallel to each other. The method further includes performing a first ion implant at a first angle substantially orthogonal to an edge of the first gate structure to form a first impurity region and performing a second ion implant at a second angle substantially orthogonal to the first ion implant to form a second impurity region under an edge of the second gate structure.

In another aspect of the invention, the method includes forming at least a first gate structure in a first direction on a substrate and forming at least a second gate structure on the substrate in a second direction, substantially orthogonal to the first direction. A first impurity region is formed under the at least first gate structure without masking the at least second gate structure and a second impurity region is formed under the at least second gate structure without masking the at least first gate structure.

In another aspect of the invention, the method includes providing a substrate including a first gate structure formed in a first direction and a second gate structure formed in a second direction substantially orthogonal to the first direction. A first ion implant is performed at a first angle substantially orthogonal to an active region of the first gate structure and parallel to an active region of the second gate structure to form a first impurity region in the active region of the first gate structure. This implant does not substantially affect an active region of the second gate structure. The method further includes performing a second ion implant at a second angle substantially orthogonal to the active region of the second gate structure and parallel to the active region of the first gate structure to form a second impurity region in the active region of the second gate structure. This second implant does not substantially affect the active region of the first structure.

DETAILED DESCRIPTION OF EMBODIMENTS OF THE INVENTION

The invention relates to a semiconductor device, and more particularly to a method of improving manufacturing processes for FETs in an integrated circuit. In accordance with the invention, a channel region of a first configurable FET(s) (e.g., with high performance gate) is formed in a first direction on the substrate (e.g., x-direction) and a channel region of a second configurable FET(s) (e.g., with long channel gate) is formed in another direction (e.g., y-direction) on the substrate. By rotating the device, an extension and halo implantation process can be performed on the channel region of the first configurable FET(s), without the need to mask the second configurable FET(s). Likewise, an extension and halo implantation process can be performed on the channel region of the second configurable FET(s), without the need to mask the first configurable FET(s). Thus, in accordance with the invention, certain processing steps can be eliminated during the fabrication of the device, e.g., eliminating masking steps during doping of either the first configurable FET(s) or the second configurable FET(s).

Figure 1:
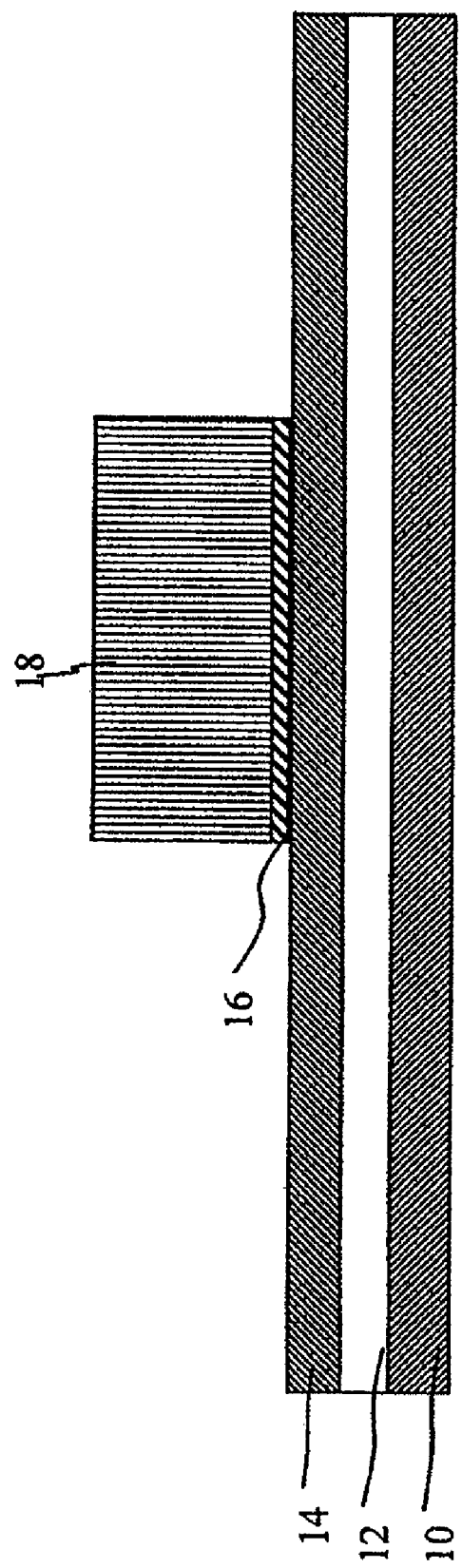
FIGS. 1 and 2 are cross-sectional views of an embodiment of a method of making a device in accordance with the invention.

Referring to FIG. 1, an example of a starting structure for an embodiment in accordance with the invention is shown. As should be recognized by those of skill in the art, the starting structure may be formed by any of the suitable methods for forming the respective structures.

In FIG. 1, an optional oxide BOX 12 is formed on a substrate 10 and an SOI layer 14 is formed on the optional BOX 12. In alternate embodiments, the substrate can be formed from any suitable substance, including silicon, silicon germanium, etc. A gate dielectric 16 is formed on the SOI layer 14. An active gate electrode (e.g., gate) 18 is formed on the gate dielectric 16. The gate dielectric 16 may be formed, for example, from an oxide, a nitride, or high k material, and may include $SiO_2$, for example. Also, the gate dielectric 16 may be in the range of approximately 0.7 nm to 2 nm, and may also vary from these specifications, depending on the specific applications. The gate 18 may be formed from, for example, a polysilicon.

In the embodiment of FIG. 1, the active gate electrode of each gate 18 can be formed in two directions: along the x-axis and the y-axis. In such an implementation, the gates in the x-direction, for example, can be used for the formation of a FET for digital devices and the gates, in the y-direction, can be used for the formation of a FET for analog devices (or vice versa). In one embodiment, the horizontal gates are high performance gates formed within critical dimensions for a digital device; whereas, the vertical gates have longer gate channels which have unique extensions and halos optimized to meet analog FET requirements (as discussed below). Thus, in accordance with the invention, the linewidth control of the long channel can be relaxed.

It should be understood by those of ordinary skill in the art that the processes for forming the starting structure may include the formation of a multiplicity of gates in both the horizontal and vertical orientations, in one processing step. In an alternative embodiment, a first set of parallel gates may be formed in a first step, and a second set of parallel gates, which are substantially perpendicular to the orientation of the previously formed parallel gates, are formed in a second step. In this manner, several parallel gates used in the formation of FETs may be provided on a single wafer.

Additionally, still referring to FIG. 1, the gate length of a FET for an analog device may be typically longer than that of the digital device. In one illustrative example, the gate of the shorter channel device (e.g., for digital device) is formed in the horizontal direction and remains within minimum critical size dimensions for digital applications, which allows for superior linewidth control and hence superior CMOS performance. In one implementation, the gate length of devices in the vertical orientation is in the range of 90 to 5000 nm. In one implementation, the gate length of device in the horizontal orientation is in the range of 20 to 45 nm. Also, the electrical requirements of the gate(s) used in an analog device will have different electrical properties than that of the digital device, by providing different dopant concentrations, etc, in later processing steps.

Figure 2:
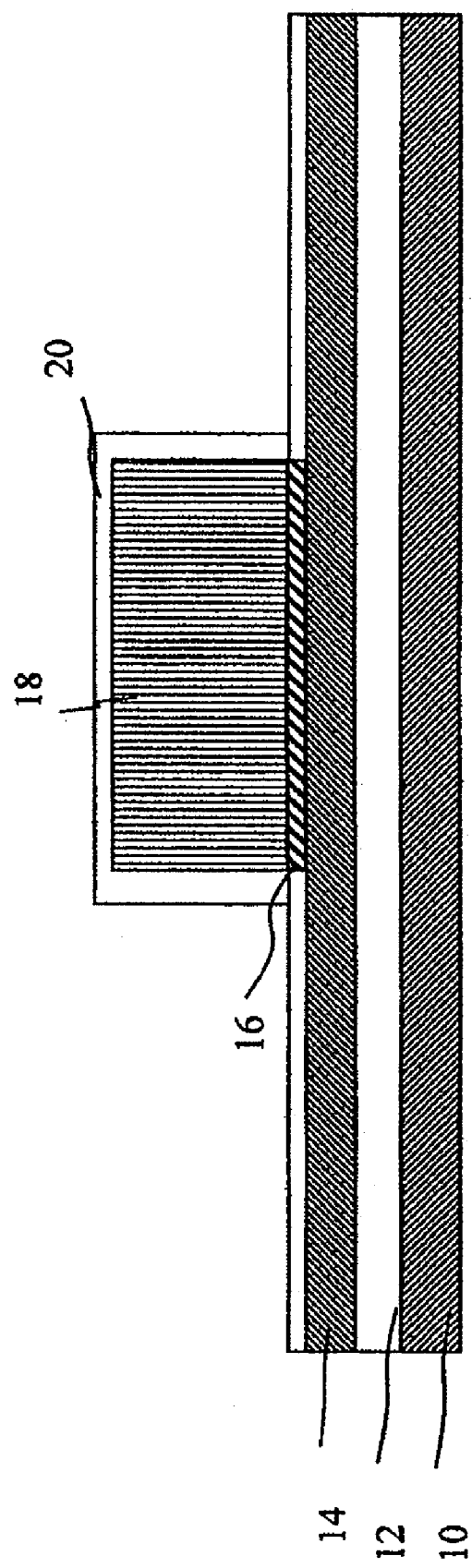

Referring to FIG. 2, in one embodiment, an oxidation process is performed to repair and protect the sidewall of the poly gate 18. The oxide, in embodiments, may be thermally grown, deposited via any well-known deposition processes, or a combination of deposition and oxidation used to form oxide layer 20. The oxide layer 20 may be in the range of, for example, 2 nm to 5 nm, although other ranges are also contemplated for use with the invention.

Figure 3B:
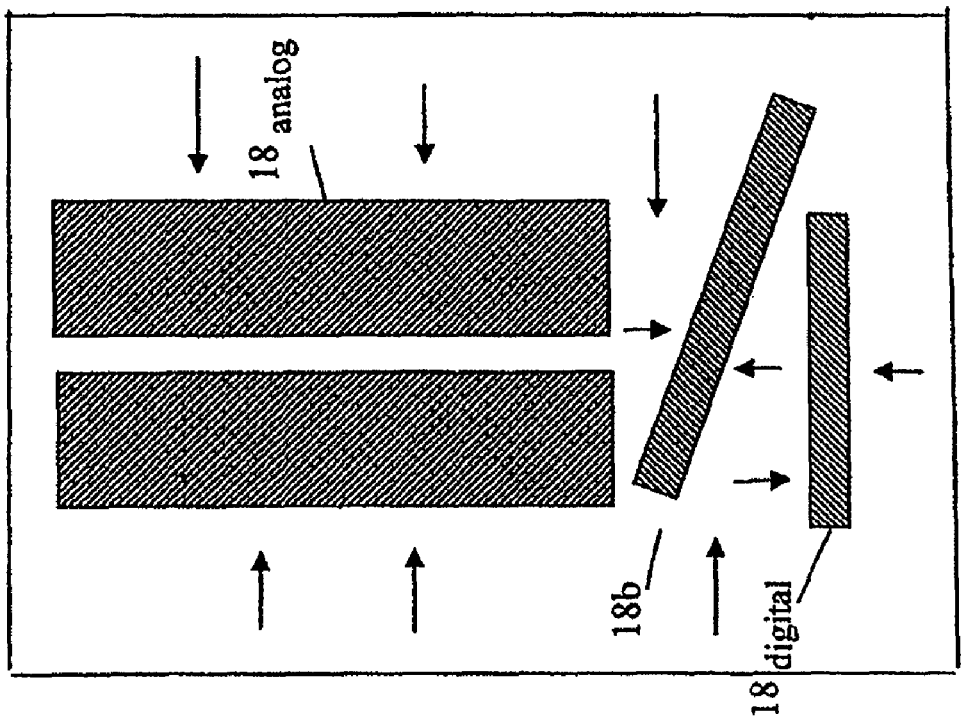
FIG. 3B is a top plan view of an embodiment in accordance with the invention.
Figure 3A:
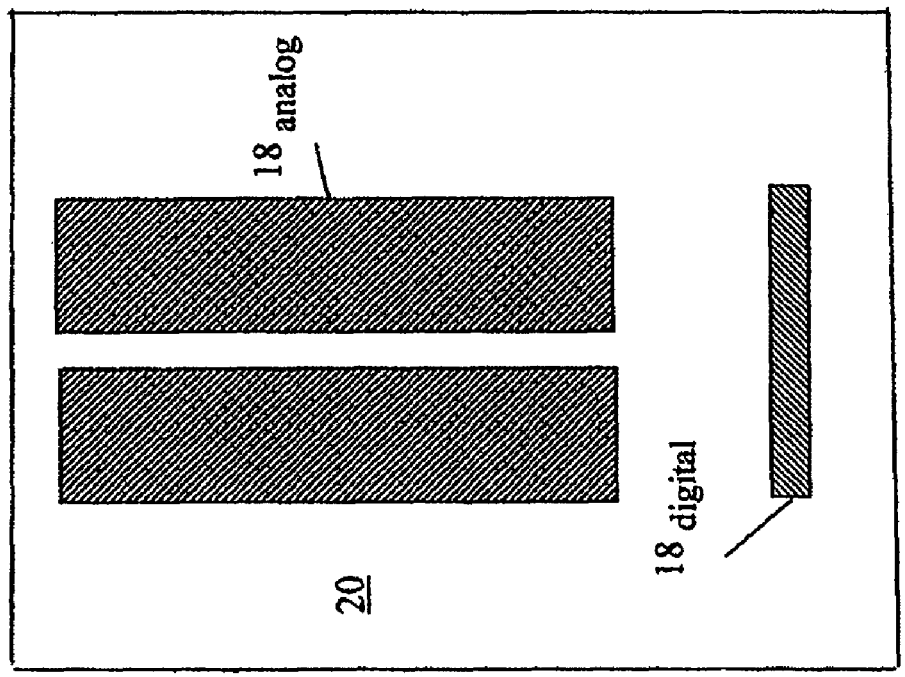
FIG. 3A is a top plan view of an embodiment in accordance with the invention.

FIG. 3A shows a top plan view of the embodiment in accordance with the invention. In this embodiment, the gates are represented as one or more parallel gates $18_{analog}$ associated with an analog device and one or more parallel gates $18_{digital}$ associated with a digital device. In this implementation, one or more gates $18_{digital}$ may be short-channel high performance digital FET gates oriented in the same "horizontal" direction to maximize linewidth control; whereas, the one or more gates $18_{analog}$ are long channel length gates oriented in the direction perpendicular to the high performance gate orientation.

FIG. 3B shows a top plan view of an embodiment in accordance with the invention. In this embodiment, the FET 18b may have a variable orientation between the orientations of the digital and analog cases, already described with reference to FIG. 3A. The FET 18b may either be a digital or analog FET, depending on the particular application. Also, in embodiments, the FET 18b has a longer channel length than the gate $18_{digital}$, as shown in FIG. 3B. This embodiment allows for the selection by layout design of FET properties between those of the analog and the digital extremes. That is, in the orientation of the gate(s) 18b of FIG. 3B, implantation processes for the gates $18_{analog}$ associated with an analog device and implantation processes for the gates $18_{digital}$ associated with a digital device will both affect the active channel region of the gate(s) 18b since partial doses of both the digital and analog implant processes for gates $18_{analog}$ and gates $18_{digital}$ reach under the edge of an active channel region of the gate(s) 18b.

Figure 4:
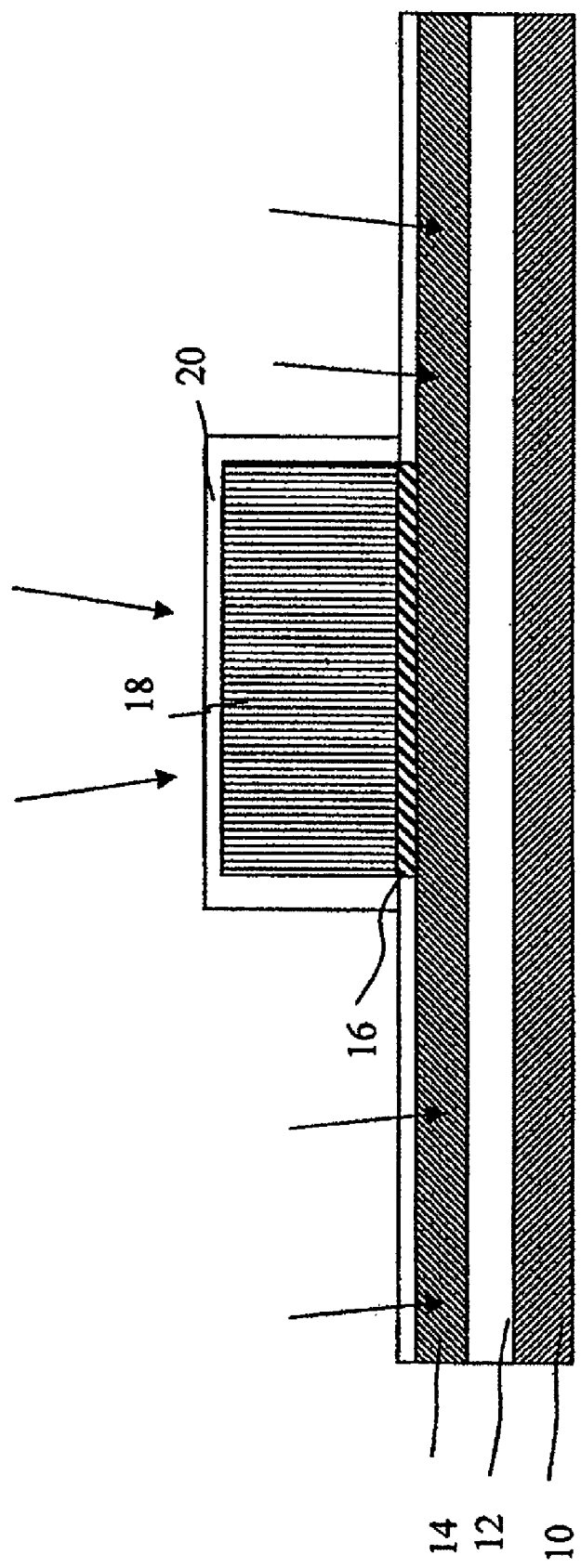
FIG. 4 is cross-sectional view of extension implantation steps in accordance with the invention for both a first type device and a second type device.

FIG. 4 represents an extension implantation process for both the vertically and horizontally oriented gates. In this process, rotated angled implants are used to optimize both the extensions of the horizontal FET for analog applications and the vertical FET for digital applications, independently, without requiring additional masks. Specifically, a first set of extension implants are performed with a first tilt angle within a plane perpendicular to the first set of parallel gates, using a first dose and energy; a second set of extension implants are performed with a second tilt angle within a plane perpendicular to the second set of parallel gates, using a second dose and energy. For example, a lower overlap of the gate over the extensions is often desirable for the digital FETs and hence the tilt angle used when implanting the digital extensions (within a plane perpendicular to the digital gates) can be smaller (i.e. more nearly vertical), and the energy may be lower, than the tilt angle and energy, respectively, used for the analog gates. Thus, "horizontal" angled implants are used for the horizontally oriented gates and "perpendicular" angled implants are used for the vertically oriented gates.

In one illustrative embodiment, a donor element such as, for example, phosphorous (P), arsenic (As), antimony (Sb), etc. is used for an nMOSFET and an acceptor element such as, for example, boron (B), indium (In), boron fluoride ($BF_2$), etc. is used for a pMOSFET. In one implementation, doping occurs at a common energy level and dosage for each of the parallel gates associated with the analog device and for each of the parallel gates associated with the digital device, depending on a particular application. Typical dopant doses for the extension region for the gate of the analog device range from $5 \times 10^{14}$ $cm^{-2}$ to $3 \times 10^{16}$ $cm^{-2}$. Typical dopant energy levels for the extension regions range from 0.1 keV to 10 keV, as illustrative examples.

The doping, due to the extension implantation of FIG. 4, provides a profile of about 100 Å to 700 Å in the SOI layer 14. It should be understood by those of skill in the art that the profile in the SOI layer 14, as well as the profile in the gate 18 are one non-limiting illustrative example, and thus may vary depending on the particular energy level and dopant concentration for a specific application.

Figure 5:
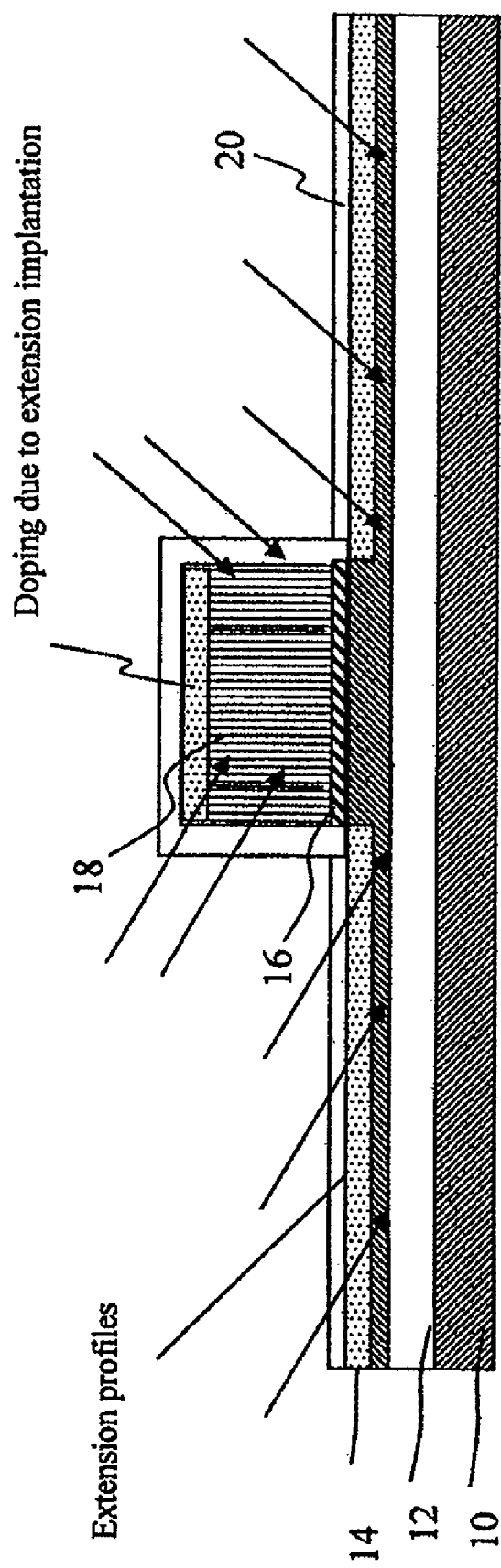
FIG. 5 is cross-sectional view of halo implant steps in accordance with the invention for both a first type device and a second type device.

FIG. 5 shows a halo implantation process, representative for both the horizontal and vertical gates $18_{digital}$, $18_{analog}$. Halo regions are implanted with angled implants tilted from a line perpendicular to the plane of the wafer. In one embodiment, the halo regions are formed by four tilted implants for the nFETs. Two implants are a tilted in a manner to implant below the two sides of the digital gates, $18_{digital}$, and two are tilted to implant below the analog gates, $18_{analog}$. The halo regions may be formed from, for example, B, In, $BF_2$, etc. with doses ranging from $1 \times 10^{13}$ $cm^{-2}$ to $2 \times 10^{14}$ $cm^{-2}$, dopant energies ranging from 1 keV to 100 keV and tilt angle ranging from 10° to 50°. Typically, the halos for the digital gates will be of higher dose to ensure adequate protection from short channel effects that can accompany the short gate lengths required. The analog gates will typically employ doses that are between 10% to 50% those of the digital gates. Lower halo doses result in lower drain conductance and body-effect, both of which are often desirable analog device properties. For a pFET type device, the halo regions may be formed from, for example, P, As, Sb, etc.

Figure 6:
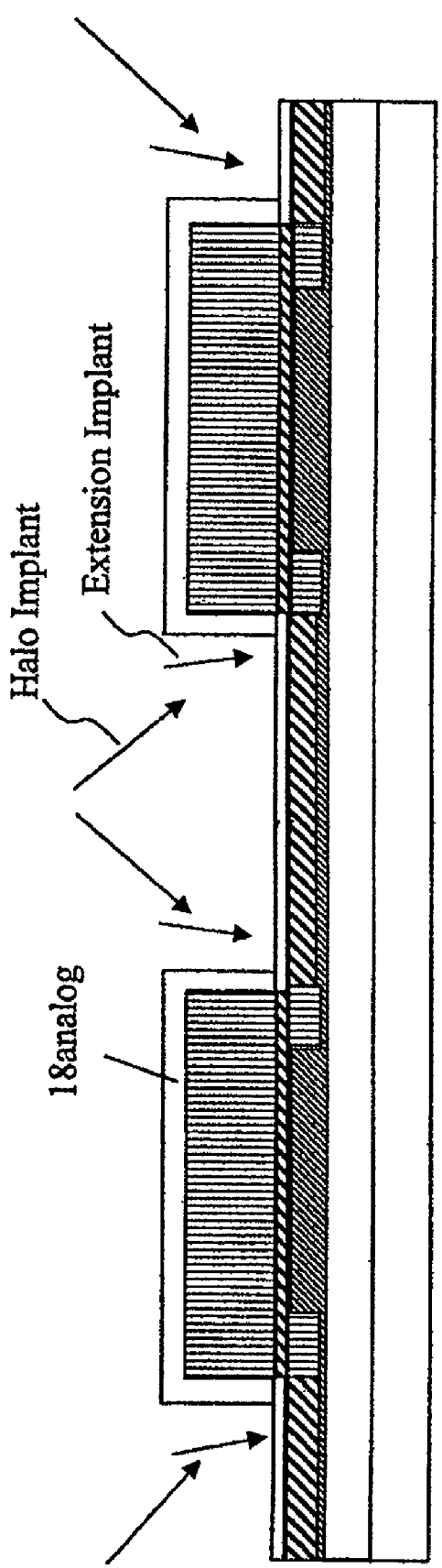
FIG. 6 is cross-sectional view of extension and halo implant steps in accordance with the invention for both a first type device, or a second type device.
Figure 7:
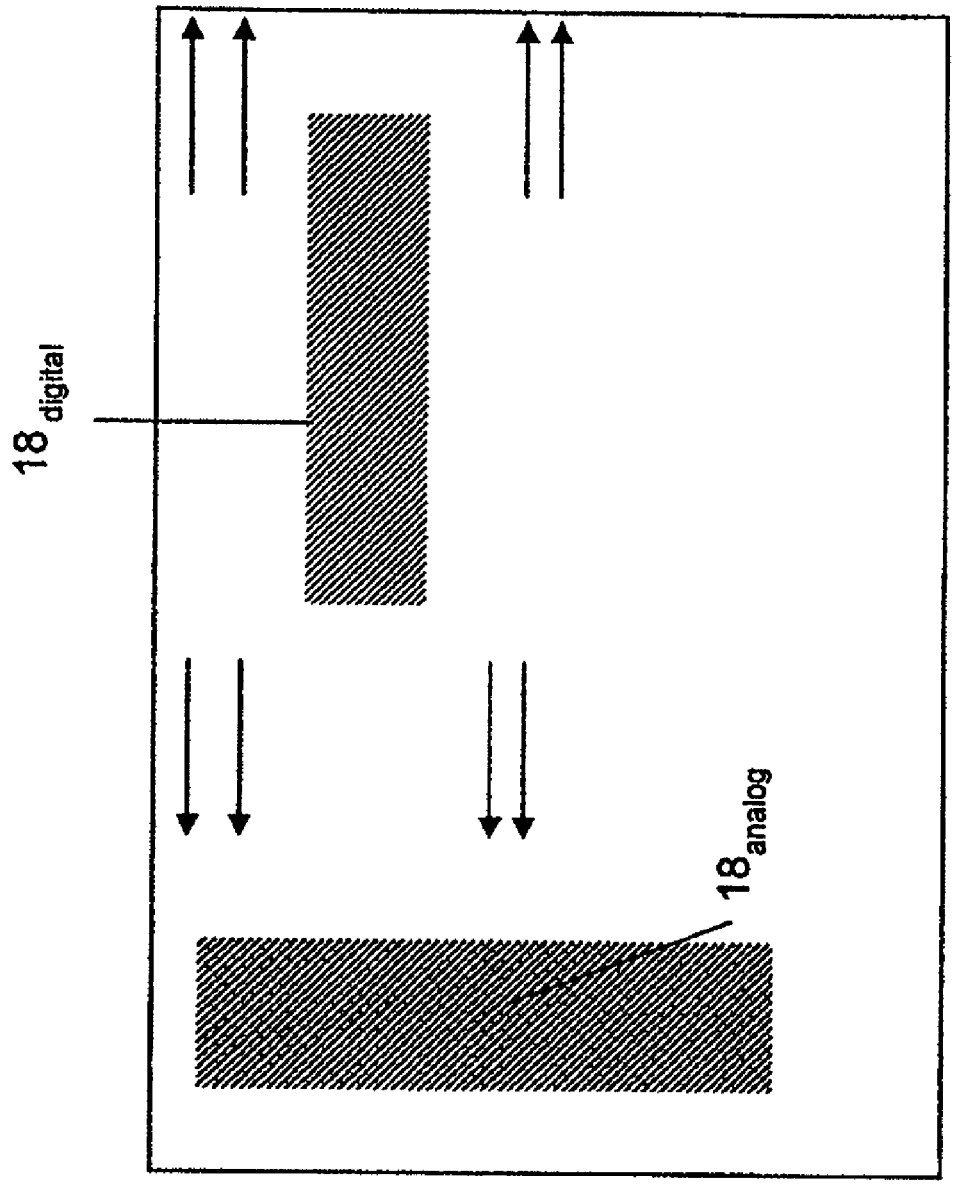
FIG. 7 is representative of a top view of the extension and halo implant for one or more gates associated with a first type device in accordance with the invention.

FIGS. 6 and 7 show a cross sectional view and a plan view, respectively, of an implant process (e.g., extension and/or halo) of only the vertical gate(s) $18_{analog}$. As should be recognized by representative FIG. 6, the halo implant process is performed typically at a steeper angle (i.e. an angle with greater tilt away from vertical) than that of the extension implantation process. As represented in this view, the implantation process is performed parallel to the active channel region of the gate(s) $18_{digital}$ and perpendicular to the active channel region of the vertical gate(s) $18_{analog}$. In this implant process, the long channel FET (e.g., gate $18_{analog}$) has unique extensions and halos optimized to meet analog FET requirements.

The implant process represented in FIG. 6 less significantly affects the active channel region of the gate(s) $18_{digital}$, than does the digital implant process, since the ions will not reach significantly under the edge of an active channel region of the gate(s) $18_{digital}$. That is, due to the orientation (e.g., substantially perpendicular) of the active regions of the gate(s) $18_{analog}$ and the direction of the implantation process, only the active regions of the gate(s) $18_{analog}$ (perpendicular to active region of the gate(s) $18_{digital}$) will be strongly affected by the halo implantation process of FIG. 6.

Additionally, the orientation of the gates with respect to one another and the direction of the implant eliminate the need for a mask over the gate(s) $18_{digital}$ during the implantation process. This is mainly due to the fact the extension/halo implant will not reach under the active channel of the gate(s) $18_{digital}$, e.g., dopants are implanted substantially parallel to an edge of the active channel region of the gate(s) $18_{digital}$ and will not reach under the channel of the gate(s) $18_{digital}$. In this process, the implantation includes, for example, doping the device with a donor element, e.g., P, As, Sb, etc. for a pMOSFET device, and an acceptor element, e.g., B, In, $BF_2$, etc. for an nMOSFET device.

As shown in FIG. 7, the implant is performed parallel to an edge of the active channel region of the gate(s) $18_{digital}$ and perpendicular to the active channel region of the vertical gate(s) $18_{analog}$. In this way, the implant does not significantly affect the active channel region of the gate(s) $18_{digital}$, since the ions will not reach under the active channel region of the gate(s) $18_{digital}$. Thus, using the embodiments of the invention, it is not necessary to form a mask over the gate(s) $18_{digital}$ during the implant of the gates $18_{analog}$, due mainly to the fact the extension/halo implantation process will not reach under the active channel of the gate(s) $18_{digital}$.

In one embodiment, the dose of the halo implantation of the gates $18_{digital}$ is higher than that of the gate(s) $18_{analog}$ and is in the range of $2.2 \times 10^{13}$ $cm^{-2}$ to about $4 \times 10^{14}$ $cm^{-2}$ at a relatively high energy such as, for example, 50 KeV for As. In this process, the implantation includes, for example, doping the device with a donor element, e.g., P, As, Sb, etc. for a pMOSFET device, and an acceptor element, e.g., B, In, $BF_2$, etc. for an nMOSFET device.

Figure 8:
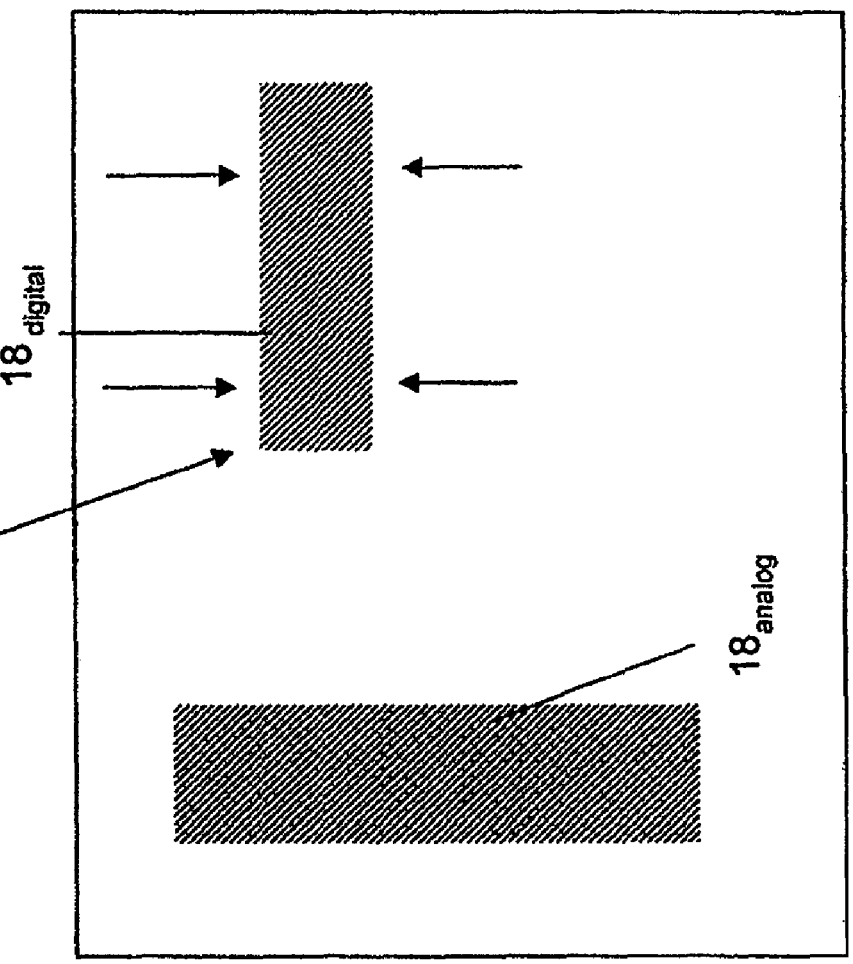
FIG. 8 is representative of a top view of the extension and halo implant for one or more gates associated with a second type device in accordance with the invention.

Referring to FIG. 8 a plan view of an implantation process (e.g., extension and/or halo) of the horizontal gate(s) $18_{digital}$ is shown. Similar to the processing steps of FIG. 6, the halo implantation process is performed typically at a steeper angle than that of the extension implantation process. Again, due to the orientation (e.g., perpendicular) of the active regions of the gate(s) $18_{digital}$ and the direction of implant, only the active regions of the gate(s) $18_{digital}$ will be affected by the implantation process.

In an additional embodiment, MOSFETs with gates oriented parallel to neither the analog nor the digital gates may be included. Furthermore, these devices may be designed to receive ion implants (e.g. extension and/or halo ion implants) from both the analog and the digital gates. As a result of these design considerations, these MOSFETs with a third orientation can have threshold voltages that are different from those of the digital or the analog MOSFETs, depending on the exact angle of orientation of the gates. Thus any number of MOSFET threshold voltages can be selected by choosing orientations that are between those of the digital and the analog gates.

As should now be understood, by forming the gate of the FET for an analog device perpendicular (orthogonal) to that of the gate of the FET for a digital device, the halo and extension implantation processes can be performed without the need for additional manufacturing processes. By way of example, by using the substantially perpendicular orientation of the gates and directional implantation, it is now possible to eliminate the masking steps for both the horizontal gate(s) and the vertical gate(s) during extension and halo implantation. In this way, the implantation process of the invention can control the threshold voltage of the gate(s) used for the analog device, while maximizing linewidth control of the high performance digital gates of the FET. Additionally, critical control dimensions of the FETs can be achieved on a single chip, regardless of analog or digital applications.

While the invention has been described in terms of exemplary embodiments, those skilled in the art will recognize that the invention can be practiced with modifications and in the spirit and scope of the appended claims.

What is claimed is:

1. A method, comprising:
   providing a substrate including at least a first gate structure and a second gate structure, the first gate structure and the second gate structure are not parallel to each other;
   performing a first ion implant at a first angle substantially orthogonal to an edge of the first gate structure and at a first tilt angle relative to vertical to form a first impurity region;
   performing a second ion implant at a second angle substantially orthogonal to the first ion implant and at a second tilt angle relative to vertical to form a second impurity region under an edge of the second gate structure, wherein the second tilt angle is different than the first tilt angle; and
   rotating the substrate approximately 90 degrees after forming the first impurity region.

2. The method of claim 1, wherein the first and second ion implants are halo and extension implants.

3. The method of claim 1, wherein the first ion implant is performed substantially parallel to a channel of the second gate structure and the second ion implant is performed substantially parallel to a channel of the first gate structure.

4. The method of claim 1, further comprising providing a third gate structure which is not parallel to the first gate structure or the second gate structure and the least one of the first ion implant and the second ion implant is not performed parallel to the third gate structure.

5. The method of claim 1, wherein the first gate structure and the second gate structure are formed substantially perpendicular to each other.

6. The method of claim 1, wherein the first ion implant is performed on the first gate structure without masking the second gate structure and the second ion implant is performed on the second gate structure without masking the first gate structure.

7. The method of claim 1, wherein the first gate structure includes two or more gates in parallel.

8. The method of claim 1, wherein the second gate structure is formed substantially perpendicular to the first gate structure and with a channel length longer than a channel length of the first gate structure.

9. The method of claim 1, wherein the first gate structure forms a field effect transistor (FET) of a digital device and the second gate structure forms a FET of an analog device.

10. The method of claim 1, wherein the first impurity region and the second impurity region are different.

11. The method of claim 1, wherein the first ion implant comprises an extension implantation process for the first gate structure and the second ion implant comprises an extension implantation process for the second gate structure, and further comprising:
    performing first halo implants on the first gate structure, wherein the first halo implants are performed at a third tilt angle that is different from the first tilt angle; and
    performing second halo implants on the second gate structure, wherein the second halo implants are performed at a fourth tilt angle that is different from the second tilt angle.

12. The method of claim 11, further comprising providing a third gate structure which is not parallel to the first gate structure or the second gate structure, wherein:
    the first ion implant and the second ion implant are performed at an angle relative to an edge of an active channel of the third gate structure;
    the first ion implant affects the active channel of the third gate structure by reaching under the edge of the active channel of the third gate structure; and
    the second ion implant affects the active channel of the third gate structure by reaching under the edge of the active channel of the third gate structure.

13. A method comprising:
    forming at least one first gate structure in a first direction on a substrate;
    forming at least one second gate structure on the substrate in a second direction, substantially orthogonal to the first direction;
    forming a first impurity region under the at least one first gate structure without masking the at least one second gate structure by ion implanting an impurity in a direction substantially parallel to an active channel region of the at least one second gate structure and at a first tilt angle relative to vertical; and
    forming a second impurity region under the at least second gate structure without masking the at least first gate structure by ion implanting an impurity in a direction substantially parallel to an active channel region of the at least one first gate structure and at a second tilt angle relative to vertical, wherein the second tilt angle is different than the first tilt angle.

14. The method of claim 13, wherein the first impurity region is different than the second impurity region.

15. The method of claim 14, wherein the first impurity region is doped at a dose in the range of $1 \times 10^{13}$ cm$^{-2}$ to $2 \times 10^{14}$ cm$^{-2}$ and the second impurity region is doped at a dose in the range of $2.2 \times 10^{13}$ cm$^{-2}$ to about $4 \times 10^{14}$ cm$^{-2}$.

16. The method of claim 13, wherein the forming the first impurity region includes using a first dopant comprising one of boron (B), indium (In), and boron fluoride (BF$_2$), or a second dopant comprising one of phosphorous (P), arsenic (As), and antimony (Sb).

17. The method of claim 13, wherein a linewidth control of the at least one second gate structure is relaxed.

18. The method of claim 13, further comprising rotating the substrate approximately 90 degrees after forming the first impurity region.

19. A method, comprising:
    providing a substrate including a first gate structure formed in a first direction and a second gate structure formed in a second direction substantially orthogonal to the first direction;
    performing a first ion implant at a first angle substantially orthogonal to an active region of the first gate structure and parallel to an active region of the second gate structure and at a first tilt angle relative to vertical to form a first impurity region in the active region of the first gate structure without substantially affecting an active region of the second gate structure; and
    performing a second ion implant at a second angle substantially orthogonal to the active region of the second gate structure and parallel to the active region of the first gate structure and at a second tilt angle relative to vertical to form a second impurity region in the active region of the second gate structure without substantially affecting the active region of the first gate structure,
    wherein the performing steps are performed without masking either of the first gate structure or the second gate structure; and
    the second tilt angle is different than the first tilt angle.

20. The method of claim 19, wherein a linewidth control of the second gate structure is relaxed.